(12) United States Patent
Donderer

(10) Patent No.: US 7,417,892 B2
(45) Date of Patent: Aug. 26, 2008

(54) ELECTRIC DEVICE WITH READABLE STORAGE DATA

(75) Inventor: Markus Donderer, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/600,968

(22) Filed: Nov. 16, 2006

(65) Prior Publication Data

US 2007/0109855 A1    May 17, 2007

(30) Foreign Application Priority Data

Nov. 16, 2005   (EP)   ................... 05025054

(51) Int. Cl.
*G11C 11/34*   (2006.01)
(52) U.S. Cl. .............................. 365/185.02; 365/185.33
(58) Field of Classification Search ............ 365/185.02, 365/185.33
See application file for complete search history.

(56) References Cited

U.S. PATENT DOCUMENTS

| 5,517,447 | A | 5/1996 | Bolan et al. |
| 6,876,400 | B2* | 4/2005 | Schnellenberger .......... 348/725 |
| 2003/0112376 | A1* | 6/2003 | Schnellenberger .......... 348/725 |
| 2004/0036808 | A1* | 2/2004 | Lendaro ..................... 348/725 |
| 2004/0052109 | A1 | 3/2004 | Geren et al. |
| 2006/0028419 | A1* | 2/2006 | Lee et al. ..................... 345/98 |

FOREIGN PATENT DOCUMENTS

EP    1 049 099 A2    11/2000

* cited by examiner

*Primary Examiner*—Michael T Tran

(57) ABSTRACT

In one aspect, an electrical device with an I2C EEPROM as a storage medium, to which a clock line and a data line are electrically connected is provided. A first terminal and a second terminal are externally accessible and in conjunction with a capacitor for buffering the I2C EEPROM enable the data stored therein to be read out with the aid of a write/read device.

11 Claims, 1 Drawing Sheet

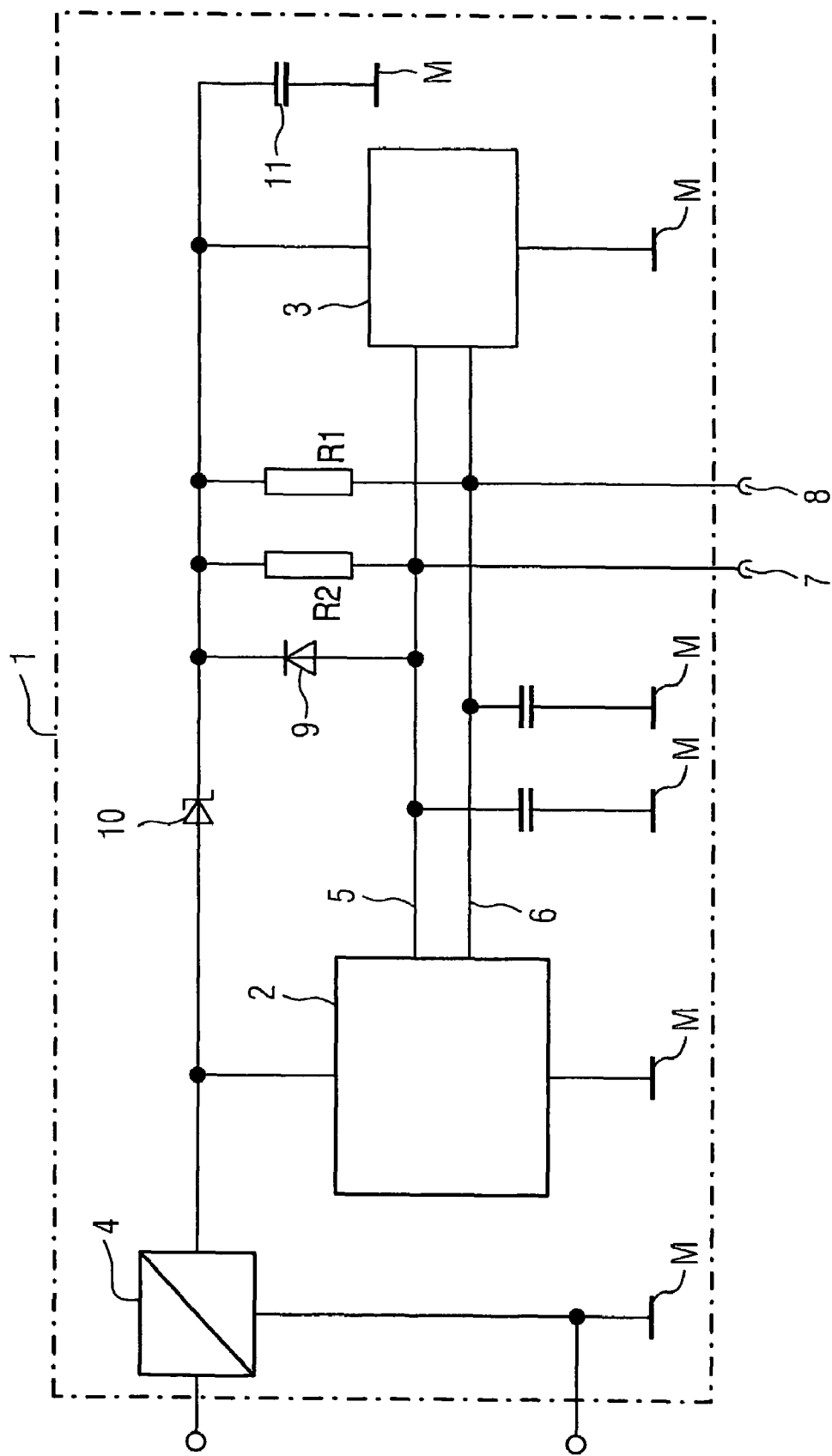

ELECTRIC DEVICE WITH READABLE STORAGE DATA

CROSS REFERENCE TO RELATED APPLICATIONS

This application claims priority of European application No. 05025054.7 EP filed Nov. 16, 2005, which is incorporated by reference herein in its entirety.

FIELD OF INVENTION

The invention relates to an electrical device with a controller, an I2C EEPROM (Electrically Erasable Programmable Read Only Memory), a power supply unit, which is electrically connected to the controller and the I2C EEPROM, a clock line and a data line, which both connect the controller to the I2C EEPROM, a first resistor connected to the data line, a second resistor connected to the clock line, with in each case the other respective terminal of the two resistors being disposed on the electrical connection between the power supply unit and the I2C EEPROM.

BACKGROUND OF INVENTION

Electrical devices of this type of higher protection class are known, with the station name and if necessary also still other data such as the name plate and maintenance information typically being stored in the storage medium, i.e. the I2C EEPROM. In order to be able to transmit the station name to a new device in the event of a defect, a changeable storage medium has previously been used, which is removed from the faulty device and is plugged into the new device. The data stored in the faulty device can generally no longer be read out.

A changeable storage medium increases the manufacturing costs, in which additional plug-in connectors, an additional module chamber, and if necessary an additional printed circuit board and a storage medium are necessary with a housing. The customer must buy this type of storage medium for each device.

SUMMARY OF INVENTION

The object underlying the invention is to improve an electrical device of the above-mentioned type, which makes the I2C EEPROM accessible to an external read/write device for reading out data stored in the I2C EEPROM with the least additional terminals possible, without the rest of the circuit having to function.

The object is achieved in that two externally accessible terminals are provided, with the first terminal being connected to the line and the second terminal being connected to the data line in that a decoupling diode lies between the power supply unit and the two resistors in the electrical connection and that a capacitor is electrically connected to the power supply terminal of the I2C EEPROM.

The advantage of this solution is that the power supply unit need not be operated, since in the event of a fault, the function of the power supply unit or of the controller can be impaired. With this solution, it is furthermore particularly advantageous for the reading device not to have to inject any additional voltage supply for the I2C EEPROM, since the supply of the I2C EEPROM is carried out by way of its I2C interface. An exemplary embodiment of the invention is described on the basis of the following drawing.

BRIEF DESCRIPTION OF THE DRAWING

The sole FIGURE shows an exemplary embodiment of an electrical device with readable storage data of the present invention.

DETAILED DESCRIPTION OF INVENTION

The drawing shows an electrical device 1 with a controller 2, an I2C EEPROM (Electrically Erasable Programmable Read Only Memory) 3 and a power supply unit 4, here for instance a DC converter. The power supply unit 4 is electrically connected to the controller 2 and the I2C EEPROM 3. The controller 2 and the I2C EEPROM 3 are electrically connected to one another by way of a clock line 5 and a data line 6. A first resistor R1 is connected to the data line 6 and a second resistor R2 is connected to the clock line 5. The respective other terminal of the two resistors R1, R2 is disposed on the electrical connection between the power supply unit 4 and the I2C EEPROM 3. Two terminals which are externally accessible are provided on the electrical device 1, with the first terminal 7 being electrically connected to the clock line 5 and the second terminal 8 being electrically connected to the data line 6. A decoupling diode 10 is disposed between the power supply unit 4 and the two resistors R1 and R2 in the electrical connection. A capacitor 11 is electrically connected to the power supply terminal of the I2C EEPROM 3. The ground pins of the circuit are designated with reference character M.

In order to read out the data stored in the I2C EEPROM 3, the read device and/or the read/write device is connected to the already existing ground pin M and the two additional terminals 7 and 8 are connected to the device. The write/read device has its own supply and provides voltage to the clock line 5 and the data line 6. Provided no transmission proceeds, the capacitor 11 is charged via the diode 10, as with an I2C bus, the high level illustrates the rest state. The diode 9 serving as a decoupler prevents the rest of the circuit from also being supplied.

Once data is transmitted over the clock line 5 and data line 6, it is drawn to the ground potential and the I2C EEPROM 3 and the resistors R1 and R2 are supplied from the capacitor 11.

As the write/read device displays the master for the communication, it can itself predetermine the transmission frequency and if necessary transmission pauses in order to recharge the capacitor 11. The capacitor 11 must be dimensioned accordingly.

The solution essentially consists in the I2C interface of the I2C EEPROM 3 being routed outwards. The addressing/identification data can be read out from a faulty device using a read/write device attached thereto.

The following advantages result with the above-described solution:

The stored data can be read out even in the event of a fault in the device. The stored maintenance information is otherwise lost.

No additional, closable opening must be created for an exchangeable change medium in the case of a device of higher protection class.

The two additional necessary terminals can, if necessary, be placed on existing plugs.

EXAMPLES

Use of a 5-pin instead of a 3-pin M12 plug-in connector,
Unused pin with e.g. a ⅞ plug can be used,
Significant cost savings compared with a solution using a changeable storage medium.

The invention claimed is:

1. An electrical device for accessing an I2C EEPROM comprising:
   a controller;
   a power supply terminal of the I2C EEPROM;
   a power supply unit electrically connected to the controller and the I2C EEPROM;
   a clock line electrically connecting the controller to the I2C EEPROM;
   a data line that electrically connects the controller to the I2C EEPROM;
   a first resistor connected to the data line and arranged on to the electrical connection between the power supply unit and the I2C EEPROM;
   a second resistor connected to the clock line and arranged on to the electrical connection between the power supply unit and the I2C EEPROM;
   a first externally accessible terminal connected to the clock line in parallel;
   a second externally accessible terminal connected to the data line in parallel;
   a decoupling diode arranged between the electrical connection of the power supply unit and the first and second resistor; and
   a capacitor electrically connected to the power supply terminal of the I2C EEPROM.

2. The electrical device as claimed in claim 1, wherein a write/read device is connected to the first externally accessible terminal and to the second externally accessible terminal, wherein the write/read device predetermines a transmission frequency.

3. The electrical device as claimed in claim 2, wherein a write/read device predetermines transmission pauses to charge the capacitor.

4. The electrical device as claimed in claim 1, wherein a 5-pin M12 connector is used for the first and second externally accessible terminal.

5. The electrical device as claimed in claim 1, wherein a ⅞ plug is used for the first and second externally accessible terminal.

6. An electrical device for accessing an I2C EEPROM comprising:
   a controller;
   a power supply unit electrically connected to the controller and the I2C EEPROM;
   a clock line that electrically connects the controller to the I2C EEPROM;
   a data line that electrically connects the controller to the I2C EEPROM;
   a first resistor connected to the data line and arranged on to the electrical connection between the power supply unit and the I2C EEPROM;
   a second resistor connected to the clock line and arranged on to the electrical connection between the power supply unit and the I2C EEPROM;
   a first externally accessible terminal connected to the clock line in parallel;
   a second externally accessible terminal connected to the data line in parallel; and
   a capacitor electrically connected to the power supply terminal of the I2C EEPROM and electrical connected to an externally accessible terminal.

7. The electrical device as claimed in claim 6, wherein a decoupling diode is arranged between the power supply unit and the first and the second resistors.

8. The electrical device as claimed in claim 6, wherein a write/read device is connected to the first externally accessible terminal and to the second externally accessible terminal, wherein the write/read device predetermines a transmission frequency.

9. The electrical device as claimed in claim 8, wherein a write/read device predetermines transmission pauses to charge the capacitor.

10. The electrical device as claimed in claim 6, wherein a 5-pin M12 connector is used for the first and second externally accessible terminal.

11. The electrical device as claimed in claim 6, wherein a ⅞ plug is used for the first and second externally accessible terminal.

* * * * *